(12) United States Patent
Noguera Serra et al.

(10) Patent No.: US 7,973,556 B1
(45) Date of Patent: Jul. 5, 2011

(54) SYSTEM AND METHOD FOR USING RECONFIGURATION PORTS FOR POWER MANAGEMENT IN INTEGRATED CIRCUITS

(75) Inventors: Juan J. Noguera Serra, Dublin (IE); Tim Tuan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/398,844

(22) Filed: Mar. 5, 2009

(51) Int. Cl.
*H03K 19/173* (2006.01)

(52) U.S. Cl. ............ 326/38; 326/41; 326/47; 365/226; 365/229

(58) Field of Classification Search ............. 326/37–41, 326/46–47; 365/226–229
See application file for complete search history.

(56) References Cited

U.S. PATENT DOCUMENTS

| | | | | |
|---|---|---|---|---|
| 6,426,908 | B1 * | 7/2002 | Hidaka | 365/222 |
| 6,525,984 | B2 * | 2/2003 | Yamagata et al. | 365/226 |
| 6,853,603 | B1 * | 2/2005 | White et al. | 365/227 |
| 7,026,840 | B1 * | 4/2006 | May et al. | 326/38 |
| 7,268,586 | B1 * | 9/2007 | Redgrave | 326/41 |
| 7,498,835 | B1 * | 3/2009 | Rahman et al. | 326/38 |
| 2005/0283704 | A1 * | 12/2005 | Ito et al. | 714/753 |
| 2008/0279017 | A1 * | 11/2008 | Shimano et al. | 365/189.06 |

OTHER PUBLICATIONS

Tuan, Tim et al., "A 90nm Low-Power FPGA for Battery-Powered Applications," *Proc. of the 2006 ACM/SIGDA 14th International Symposium on Field Programmable Gate Arrays*, Feb. 22-26, 2006, pp. 3-11, Monterey, California, USA.
Tuan, Tim et al., "Leakage Power Analysis of a 90nm FPGA," *Proc. of the IEEE 2003 Custom Integrated Circuits Conference*, Sep. 21-24, 2003, pp. 57-60, San Jose, California, USA.
Anderson, Jason H. et al., "Active Leakage Power Optimization for FPGAs," *Proc. of the 12th International Symposium on Field Programmable Gate Arrays*, Feb. 22-24, 2004, pp. 1-11.

* cited by examiner

*Primary Examiner* — Jason M Crawford
(74) *Attorney, Agent, or Firm* — Steve Slater; LeRoy D. Maunu

(57) ABSTRACT

A method of operating an integrated circuit having a circuit block configurable by a configuration memory is disclosed. The method includes determining whether to operate the circuit block in a normal operation mode or a low power mode. The configuration memory is loaded with normal operation mode configuration data for the circuit block if the normal operation mode is determined. If the low power mode is determined, the configuration memory is loaded with low power mode configuration data for the circuit block.

20 Claims, 9 Drawing Sheets

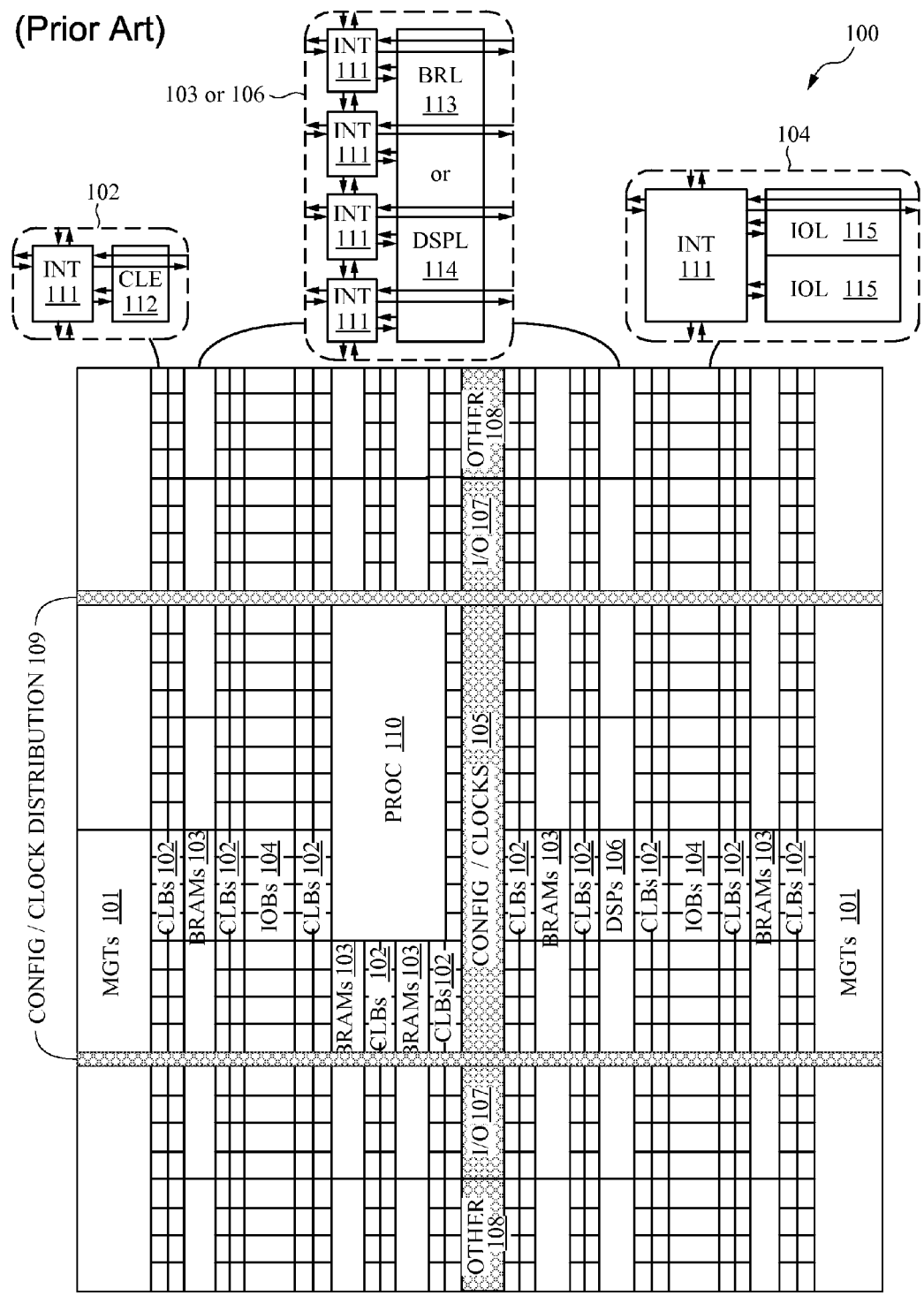

SYSTEM AND METHOD FOR USING RECONFIGURATION PORTS FOR POWER MANAGEMENT IN INTEGRATED CIRCUITS

FIELD OF THE INVENTION

The invention relates to integrated circuit devices (ICs). More particularly, the invention relates to a system and method for using reconfiguration ports for power management in integrated circuits.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), embedded digital signal processing blocks (DSPs), embedded processors (e.g., PowerPC), digital clock managers (DCMs), delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the number of logic blocks in a column, the relative width of the columns, the number and order of the columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

As transistor dimensions have been shrinking and circuit density has been increasing in the semiconductor processes used to implement FPGA's, static and dynamic power consumption have become a design challenge in modern FPGAs. Several techniques have been proposed to reduce the power consumption of FPGAs. For example, power-gating and dual power supply architectures can be used to reduce static power, and clock-gating and frequency-scaling can be used to minimize the dynamic power consumption. One drawback of these techniques is that additional user logic (e.g., lookup tables (LUTs) and flip-flops) is required for their implementation. For example, clock-gating requires user logic to stop or enable the clock. Such additional user logic can reduce the maximum number of functions that are programmable on a particular FPGA.

To accommodate power control in high density integrated circuits with programmable circuit blocks, what is needed are circuits and systems that allow for robust power control while allowing for high programming density.

SUMMARY

In one embodiment, a method of operating an integrated circuit having a circuit block configurable by a configuration memory is disclosed. This method includes determining whether to operate the circuit block in a normal operation mode or in a low power mode. The configuration memory is loaded with normal operation mode configuration data for the circuit block if the normal operation mode is determined. If the low power mode is determined, the configuration memory is loaded with low power configuration mode data for the circuit block.

In another embodiment, a power managed circuit system is disclosed. The system has a configurable circuit block, a configuration memory configured to configure the circuit block, and a reconfiguration interface configured to write configuration data to the configuration memory. The system also has a power management unit coupled to the reconfiguration interface. The power management unit is configured to determine one of a plurality of circuit block operation modes and initiate writing the configuration memory with a data set corresponding to the one of the plurality of circuit block operation modes though the reconfiguration interface. The plurality of circuit block operation modes includes a normal operation mode and a low power operation mode.

In yet another embodiment, a power management controller includes mode determination logic and a power management interface. The mode determination logic is configured to determine whether a circuit block operates in one of a plurality of power modes. The circuit block is coupled to a configuration memory, the configuration memory controls a configuration of the circuit block, and the configuration of the circuit block is based on a power mode. The power management interface is configured to be coupled to a reconfiguration interface. The reconfiguration interface is configured to write to the configuration memory, and the power management interface is configured to command the reconfiguration interface to load the configuration memory with configuration data corresponding to one of the plurality of power modes.

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a block diagram of an exemplary prior art FPGA;

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention is described with respect to embodiments in a specific context, namely a system and method of controlling power consumption of configurable blocks in an integrated circuit such as a programmable logic device (PLD), e.g., a field programmable gate array (FPGA). However, embodiments of this invention may also be applied to other circuits and systems that require power control of programmable circuit blocks.

Figure 2A:
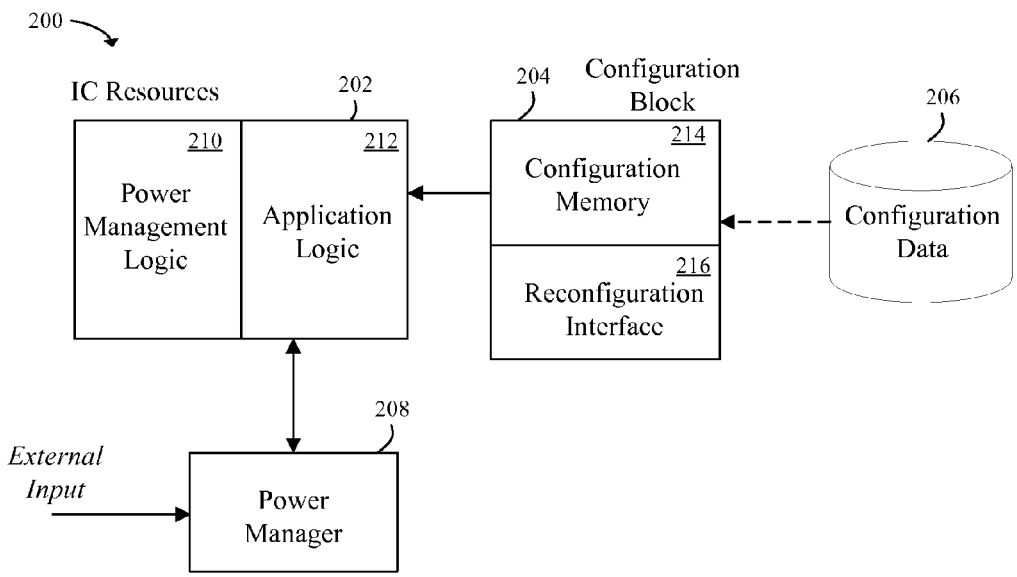
FIG. 2a is a block diagram of a prior art power control system for an integrated circuit.

A block diagram of a prior art power management system 200 for an integrated circuit is shown in FIG. 2a. The integrated circuit can be a PLD, e.g., an FPGA. IC resource 202 has user programmable logic configured to serve as application logic 212 and power management logic 210. Application logic 212 is logic used to implement a target application, for example a DSP block or a bus interface. Power management logic 210, on the other hand, includes IC resources specifically devoted to implementing power management circuits, for example, logic to control a clock domain via clock gating. Power manager block 208, which can be either internal or external to IC 202, controls power management logic 210 based on power control algorithms or external input.

Prior art system 230 of FIG. 2a also includes a configuration block 204 that contains configuration memory 214 and reconfiguration interface 216. In preferred embodiments, IC resources 202 and configuration block 204 reside on the same integrated circuit. Configuration memory 214 stores the configuration state of user programmable resources on IC 202. Reconfiguration interface 216 reads configuration data 206 and writes the data to configuration block 204. Power manager block 208 is independent from configuration block 204.

Figure 2B:
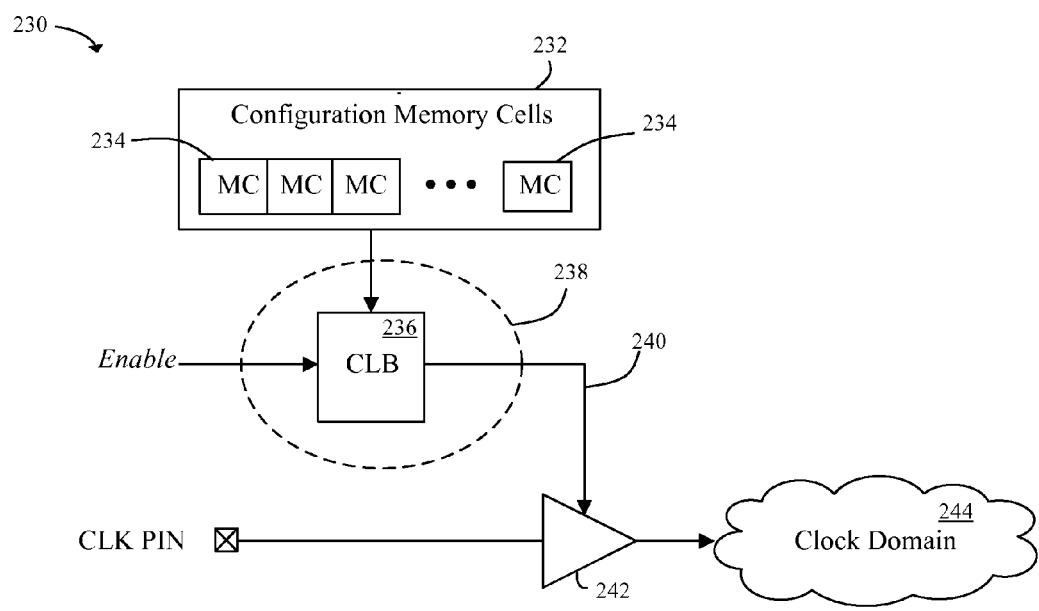
FIG. 2b is a schematic of a prior art clock gating system for an integrated circuit.

Turning to FIG. 2b, an example of a prior art power control circuit implemented on an integrated circuit is shown. Configuration memory cells in configuration memory portion 232 control the configuration of CLB 236, which in this case serves as enable logic for gated clock buffer 242. CLB 236 is a subset of user-logic for power management logic 238. Power management logic 238 may contain other power management logic for controlling, enabling, or disabling circuits within application logic 212 (FIG. 2a). Enable signal Enable is coupled to an input of CLB 236 and clock gating signal 240 is coupled to an output of CLB 236. Clock gating signal 240 is used to enable or disable clock buffer 242, which buffers a clock signal at CLK PIN to clock domain 244. It can be seen that user programmable IC resources are necessary to enable and disable clock buffer 242 in prior art embodiments.

Figure 3A:
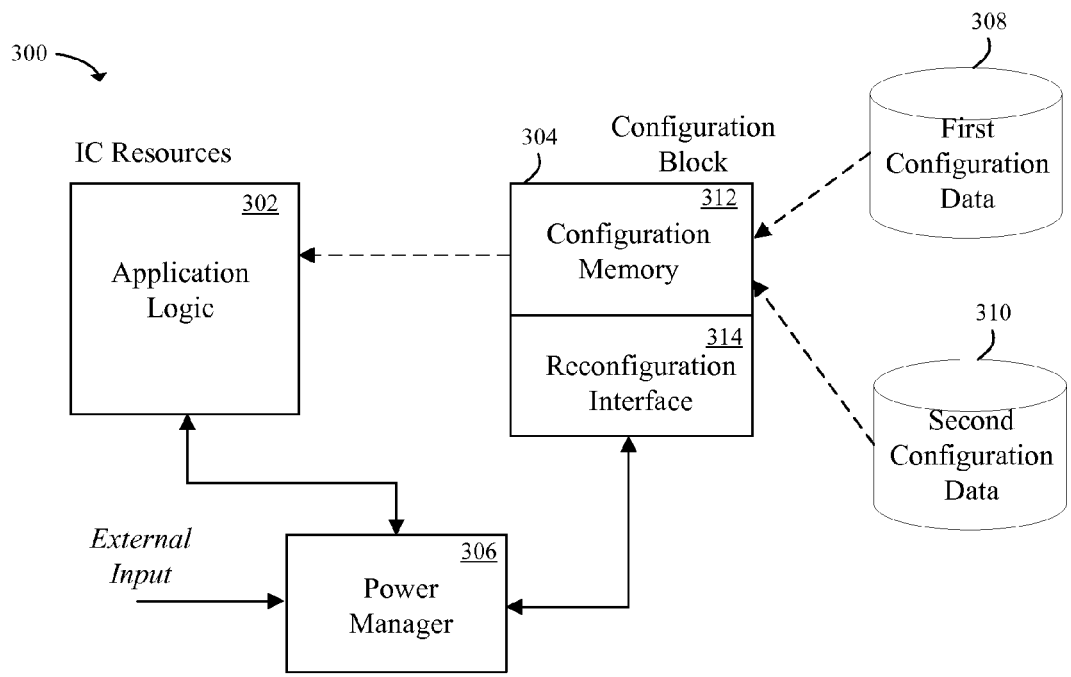
FIG. 3a is a block diagram of an embodiment power control system for an integrated circuit.

A block diagram of an embodiment power management system 300 for an integrated circuit is shown in FIG. 3a. Power management system 300 and the other systems illustrated herein can be included in or applied to FPGAs, for example, or to other programmable logic devices (PLDs), or to integrated circuits other than PLDs. Power management system 300 has IC resources including application logic 302 made of user configurable logic, which is configured by configuration block 304. Configuration block 304 has configuration memory 312 and reconfiguration interface 314. In some embodiments, IC resources 302 and configuration block 304 reside on the same integrated circuit. In alternative embodiments, either one or both of configuration memory 312 and reconfiguration interface 314 can be implemented externally to the integrated circuit containing application logic 302.

Reconfiguration interface 314 is configured to load first configuration data 308 and second configuration data 310 into configuration memory 312. In some embodiments, first configuration data 308 corresponds to an application logic configuration that operates in a normal power mode, while second configuration data 310 corresponds to application logic that operates in a reduced, low-power, or shut down mode.

Power manager 306 interfaces to reconfiguration interface 314 and to application logic 302. In some embodiments, power manager 306 determines a power mode in which application logic 302 operates. Power manager 306 can make this determination based on external input, such as power control pins and interrupts. In other embodiments, power manager 306 can make a power mode determination based on a state of application logic 302. Alternatively or additionally, power manager 306 can make power mode determinations based on temperature, data traffic, power consumption, battery level, timer states, and/or other conditions. For example, if certain blocks within application logic 302 that are in a normal power mode are not being used within a certain period of time, power manager 306 can place these particular blocks in a different power mode or lower power mode. In other embodiments, other power mode determination schemes can be used.

Figure 3B:
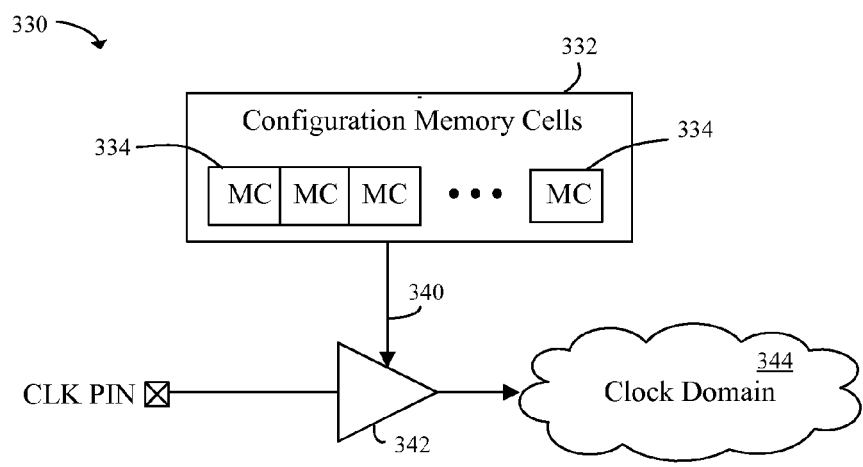
FIG. 3b is a schematic of an embodiment clock gating system for an integrated circuit.

FIG. 3b illustrates a block diagram of an embodiment power control circuit 330. Configuration memory 332 having memory cells 334 directly controls the clock gating of clock buffer 342 which supplies a clock signal to clock domain 344 from input CLK PIN. In preferred embodiments of the present invention, clock buffer 342 is implemented using user programmable logic configured by configuration memory 332 via line 340. Rather than performing clock gating controlled by user logic, as is the case with the prior art example of FIG. 2b, the clock buffer power mode is directly controlled by configuration memory 332. Here the clock domain is not controlled by user logic, but directly controlled by using partial reconfiguration techniques on existing configuration memory cells. Controlling the clock buffer 342 with configuration memory 332 is more area efficient, because it does not require additional user logic and/or IC resources, to implement the clock gating technique, but instead uses existing configuration memory 332 to perform the clock gating function.

One programmable element commonly found in PLD logic blocks is the lookup table, or LUT. A LUT is a memory array (e.g., a 16×1 array) addressable by a number of input signals (e.g., four input signals). By programming predetermined values into the memory array, the LUT can implement any function of the input variables. While 4-input LUTs are common, LUTs having more or fewer input signals can also be implemented that will accommodate larger or smaller logic functions.

Figure 4A:
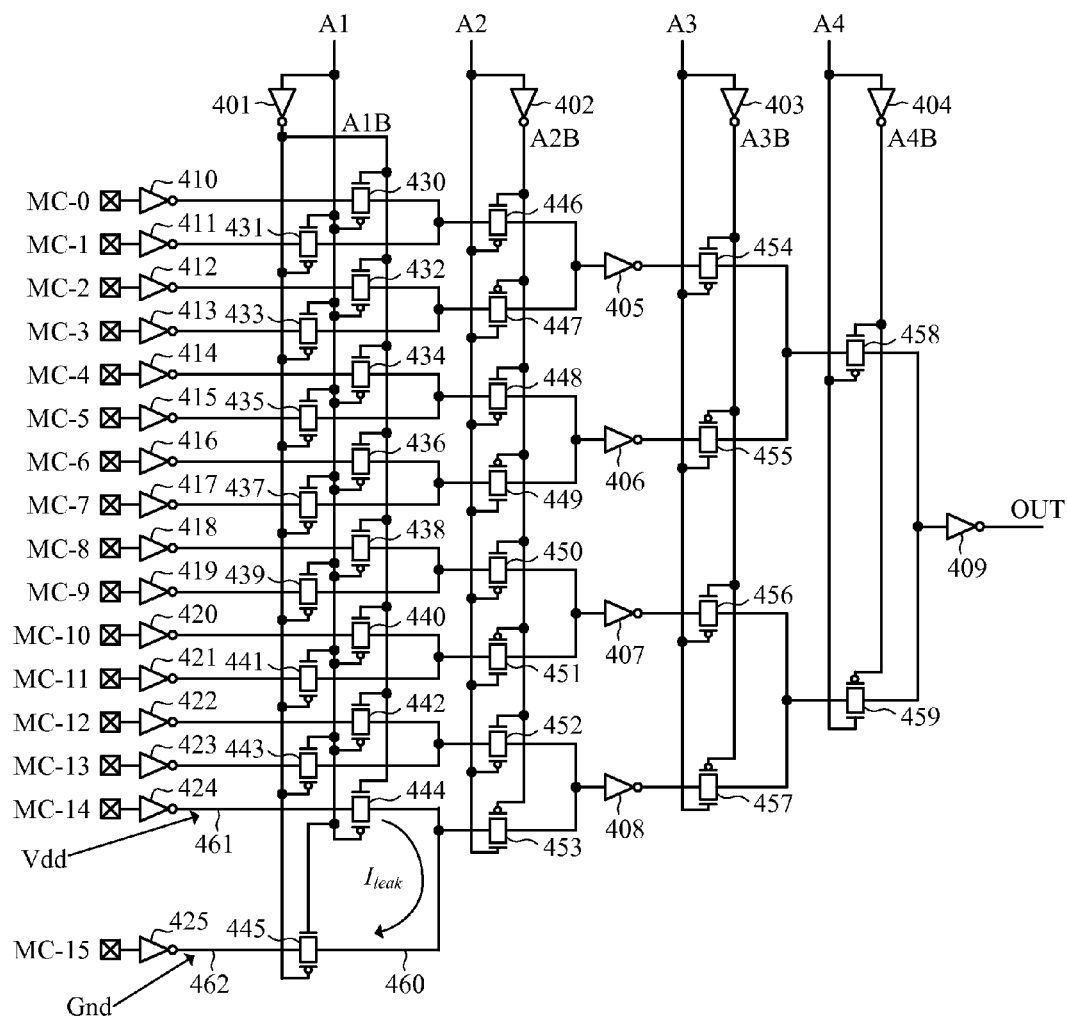
FIG. 4a illustrates a prior art lookup table circuit.

FIG. 4a illustrates in simplified form a well known 4-input lookup table (LUT) for a PLD. The lookup table is implemented as a four-stage 16-to-1 multiplexer. The four input signals A1-A4 together select one of 16 values stored in memory cells MC-0 through MC-15. Thus, the lookup table can implement any function of up to four input signals.

The four input signals A1-A4 are independent signals, each driving one stage of the multiplexer. Inverted versions A1B-A4B of signals A1-A4 are generated by inverters 401-404, respectively. Sixteen configuration memory cells MC-0 through MC-15 drive sixteen corresponding inverters 410-425, each of which drives a corresponding CMOS pass gate 430-445. In a first stage of the multiplexer, paired pass gates 430-431 form a 2-to-1 multiplexer controlled by signals A1 and A1B, which multiplexer drives a CMOS pass gate 446. Pass gates 432-445 are also paired in a similar fashion to form similar 2-to-1 multiplexers driving associated pass gates 447-453. In a second stage of the multiplexer, paired pass gates 446-447 form a 2-to-1 multiplexer controlled by signals A2 and A2B, which multiplexer drives an inverter 405. Similarly, pass gates 448-453 are paired to form similar 2-to-1 multiplexers driving associated inverters 406-408.

In a third stage of the multiplexer, driven by inverters 405-408, pass gates 454-455 are paired to form a 2-to-1 multiplexer controlled by signals A3 and A3B and driving a CMOS pass gate 458. Similarly, pass gates 456-457 are paired to form a similar 2-to-1 multiplexer driving a CMOS pass gate 459. In a fourth stage of the multiplexer, pass gates 458-459 are paired to form a 2-to-1 multiplexer controlled by signals A4 and A4B and driving an inverter 409. Inverter 409 provides the LUT output signal OUT.

The LUT of FIG. 4a, however, leaks current during normal operation. For example, if node 461 is at a logic high state (Vdd), node 462 is at a logic low state (Gnd), CMOS pass gate 444 is on, and CMOS pass gates 453 and 445 are off, a small leakage current $1_{leak}$ will flow from the output of inverter 424 to the output of inverter 425. Consequently, the leakage of the LUT is dependent on the values of memory cells MC-0 to MC-15.

In some embodiment LUT architectures, the LUT will leak more current in one particular output state than the LUT will leak in another output state. For example, an LUT may leak less when outputting a logic "0" than it would leak if outputting a logic "1." In this case, the LUT can be reconfigured to output a logic "0" in a power down state in order to reduce leakage current.

Figure 4B:
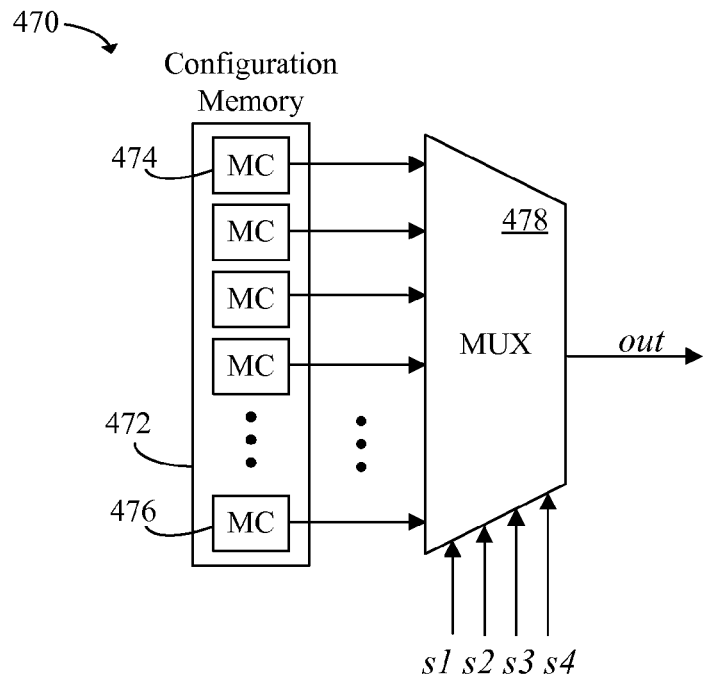
FIGS. 4b and 4c are schematics of embodiment circuits for applying power control to a multiplexer.
Figure 4C:
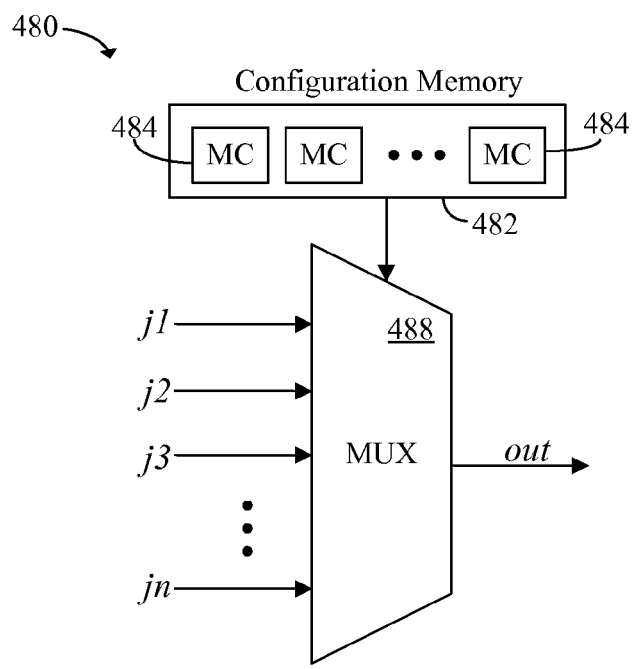

FIGS. 4b and 4c illustrate embodiment methods of providing power control to reduce static leakage in multiplexers. These methods can be applied, for example, to LUTs in PLDs. However, they can also be applied to other multiplexers, and/or multiplexers in ICs other than PLDs.

FIG. 4b illustrates an embodiment circuit 470 for controlling multiplexer 478 implemented as a LUT. In some embodiments of the present invention, multiplexer based LUTs are used to implement logical functions within CLBs in FPGA application logic. Configuration memory cells 474 within configuration memory 472 are coupled to the input of multiplexer 478. Select lines s1, s2, s3, and s4 are used as address lines for the LUT. During a normal operation mode, multiplexer 478 is configured to perform a lookup table function according to a configured user application. In a low power configuration, however, memory cells 474 are reprogrammed to a state that reduces static leakage. For example, leakage current can be reduced by setting all inputs of multiplexer 478 to either supply (power high) or to ground.

FIG. 4c illustrates an embodiment circuit 480 for controlling a multiplexer 488 that can be used to implement a routing switch within the integrated circuit. Again, in a normal power mode memory cells 484 within configuration memory 482 are programmed according to a user logic configuration. In low power mode, however, memory cells 484 are reprogrammed to place multiplexer 488 in a low leakage state. For example, all select inputs can be set to shut off all pass transistors within multiplexer 488.

Figure 5A:
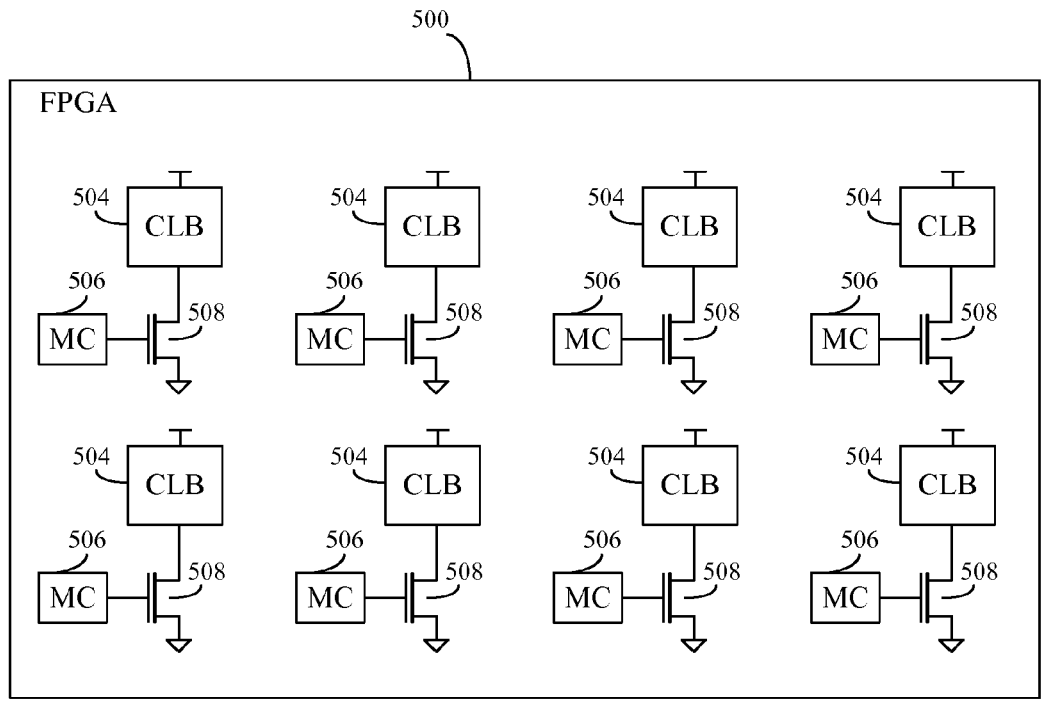
FIGS. 5a-5d illustrate schematics of embodiment systems for shutting down logic blocks in an integrated circuit.

Turning to FIG. 5a, an embodiment power control circuit 500 is illustrated that provides power mode control to CLBs 504. Switch 508 is coupled between CLB 504 and ground and switch 508 is controlled by memory cell 506. For a CLB that is in a normal operation mode, switch 508 can be closed. For a CLB in a low power or power-down state, switch 508 can be open. Each CLB 504 represents a configurable logic block that corresponds to a logical function or a set of logical functions. If a particular logical function implemented by CLB 504 is not necessary or is unused in a particular power down state, opening switch 508 not only disables the particular logical function, but it also lowers static leakage current by placing the high impedance of open switch 508 in series with the power supply of CLB 508. It can be seen that in alternative embodiments of the present invention, switch 508 can be coupled in series with VDD.

Figure 5B:
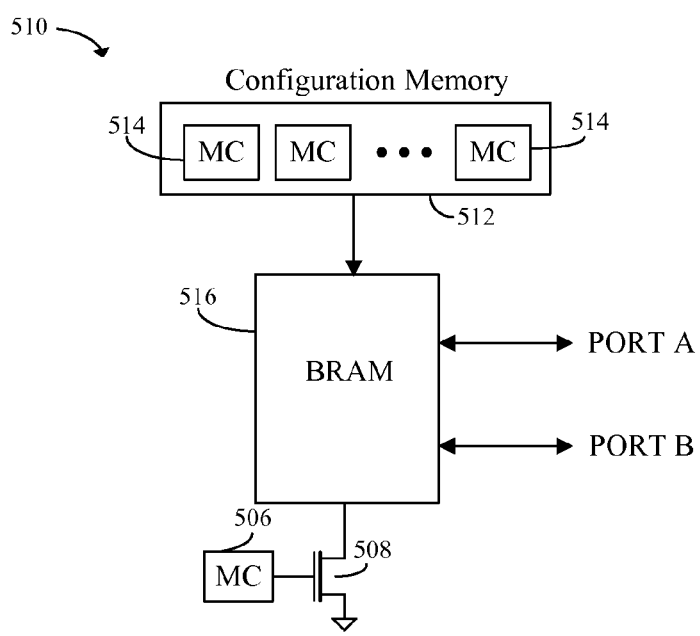

FIG. 5b illustrates an embodiment power control circuit 510 for controlling the power state of a dedicated random access memory block 516 (BRAM) having two ports, PORT A and PORT B. Configuration memory cells 514 within configuration memory 512 control the state of BRAM 516. The power of BRAM 516 can be managed, for example, by selecting different bit widths and read/write modes. Additionally, switch 508 controlled by memory cell 506 can be coupled between ground and BRAM 516 to shut off power to the block. Alternatively, the power consumption of BRAM 516 can be controlled only by switch 508 or only by configuration memory cells 514. In alternative embodiments, BRAM 516 can have greater than or less than the two ports shown in FIG. 5b.

Figure 5C:
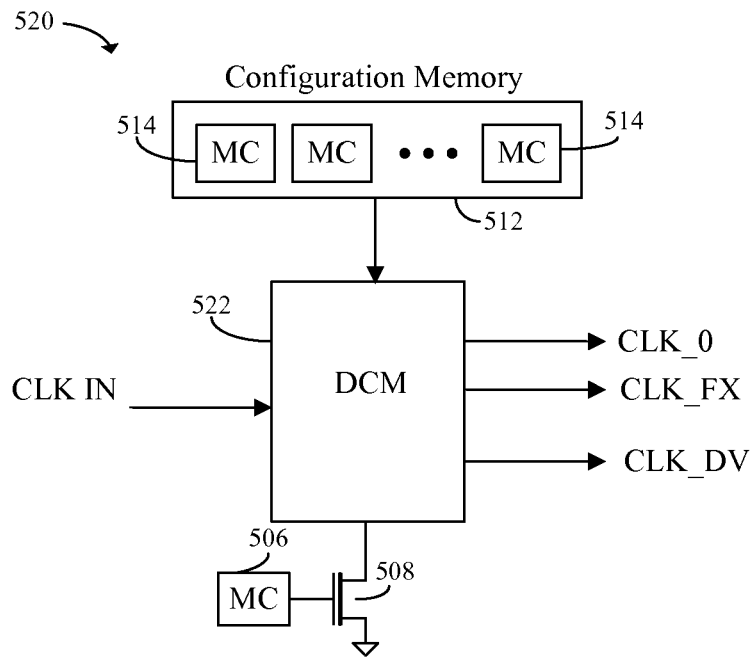

FIG. 5c illustrates an embodiment power control circuit 520 for controlling the power state of digital clock manager block 522 (DCM) having input CLK IN and clock outputs CLK_0, CLK_FX and CLK_DV. Configuration memory cells 514 within configuration memory 512 control the state of DCM 522. DCM 522 can be configured to consume less power by disabling analog blocks such as regulators. Dynamic power consumption can be achieved by applying frequency scaling to reduce clock frequencies. Additionally, switch 508 controlled by memory cell 506 can be coupled between ground and DCM 522 to shut off power to the block. Alternatively, the power consumption of DCM 522 can be controlled only by switch 508 or only by configuration memory cells 514. It should be noted that clock outputs CLK_0, CLK_FX, and CLK_DV are shown as examples. Embodiment DCMs 522 of the present invention may employ greater or few clock outputs than the three outputs CLK_0, CLK_FX, and CLK_DV shown. It should be further appreciated that the electrical characteristics of these outputs CLK_0, CLK_FX, and CLK_DV as well as input CLK IN can vary according to the embodiment and the particular application.

Figure 5D:
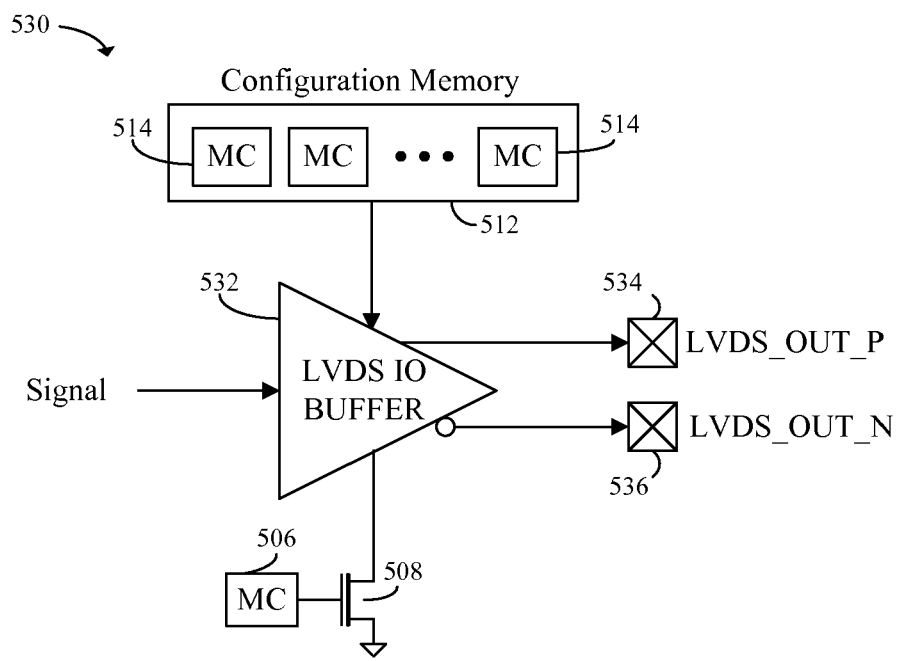

FIG. 5d illustrates an embodiment power control circuit 530 for controlling the power state of low voltage differential signaling (LVDS) I/O buffer 532 having a signal input and differential outputs LVDS_OUT_P and LVDS_OUT_N. Configuration memory cells 514 within configuration memory 512 control the state of LVDS I/O buffer 532, which can be configured to consume less power by selecting lower power I/O standards, low slew rates, and lower driver currents. Additionally, switch 508 controlled by memory cell 506 can be coupled between ground LVDS I/O buffer 532 to shut off power to the block. Alternatively, the power consumption of LVDS I/O buffer 532 can be controlled only by switch 508 or only by configuration memory cells 514. In alternative embodiments of the present invention, similar power control can be applied to other types of buffers including, but not limited to, low voltage CMOS (LVCMOS), various types of stub series terminated logic (SSTL), etc.

It should be understood that BRAM 516 of FIG. 5b, DCM 522 of FIG. 5c and LVDS I/O buffer 532 of FIG. 5d are only a few examples of different ways that the power consumption of IC resources can be controlled by configuration memory. It should be understood that the concepts of the present invention apply to other hardware resources including but not limited to embedded multipliers, MGTs, and embedded processors. It can be seen that in alternative embodiments of the present invention, other circuit blocks can be operated in normal or low power modes by a combination of configuration control and/or series power switching.

Figure 6A:
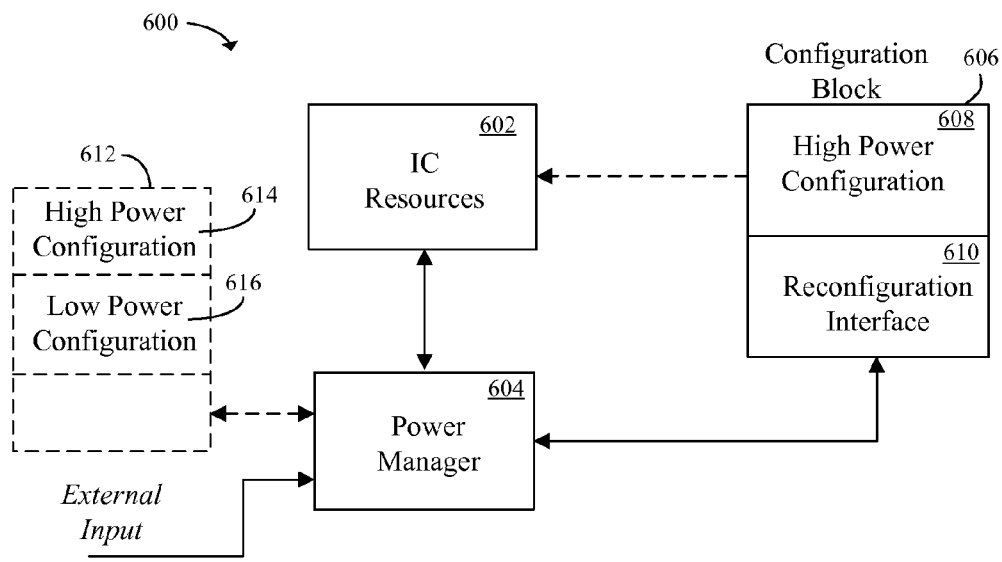
FIGS. 6a and 6b are block diagrams of embodiment power control systems for an integrated circuit.
Figure 6B:
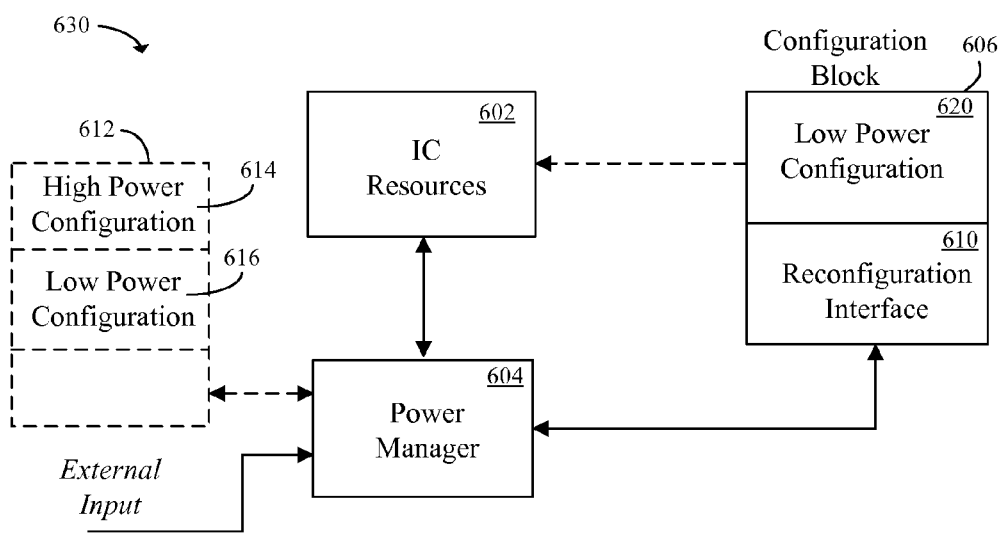

FIGS. 6a and 6b illustrate an implementation of an embodiment power mode control system in a high power and in a low power state. FIG. 6a illustrates power mode control system 600 in a high power state. System 600 has power manager 604 that implements a power management strategy or algorithm. For example, power manager 604 may determine whether or not to turn on a clock tree depending on the power mode. Power manager 604 also executes a partial reconfiguration of configuration block 606. In a preferred embodiment of the present invention, power manager 604 reads configuration data from memory and sends the configuration data to reconfiguration interface 610. Embodiments of power manager 604 can be implemented in a variety of ways. For example, in some embodiments, power manager 604 can be implemented using internal user programmable logic in IC resource block 602. In other embodiments, power manager 604 can also be implemented by using a CPU external to the IC, an embedded CPU, or finite state machines, for example. Embedded CPUs can be implemented as a custom design or by commercially available CPU cores such as PowerPC or Microblaze processors.

In embodiments where power manager 604 is implemented using IC resource block 602, the use of power manager 604 on the IC preferably does not use overhead over and above prior art embodiments, where power management functionality is also required. (See FIG. 2a.)

In some embodiments of the present invention, reconfiguration interface 610 is used to access configuration block 606. Reconfiguration interface 610 can be implemented as an external interface using, for example, a SelectMAP interface, or internally using, for example, an Internal Configuration Access Port (ICAP) interface. In alternative embodiments of the present invention, other interface protocols can also be used. Dotted line 609 between configuration block 606 and IC resources 602 indicates that configuration block 606 controls IC resources 602.

In some embodiments, IC resource block 602 has a variety of configurable blocks such as LUTs, digital clock managers (DCMs), and clock trees, for example. These blocks can be configured with different bitstreams having different power consumption levels when implemented on its target logic by IC resource block 602. These configuration bitstreams are stored in external memory 612 in some embodiments. For example, in FIGS. 6a and 6b, memory 612 stores a high power configuration bitstream 614 in one portion of memory 612, and a low power configuration bitstream 616 in another portion of memory 612. Memory 612 can be implemented external memory, internal memory, on-chip memory on the IC, an in-package memory chip using die stacking technology, or other memory schemes, for example. In alternative embodiments of the present invention, power manager 604 controls configuration block 606 by updating configuration block 606 though the reconfiguration interface 610 without loading an entire configuration bitstream. In such embodiments, memory 612 can be omitted.

FIG. 6a illustrates power mode control system 600 with high power configuration 608 loaded in configuration block 606, and FIG. 6b illustrates power mode control system 630 loaded with low power configuration 620 loaded in configuration block 606. It should be noted that in alternative embodiments of the present invention, more than two power modes can be implemented. For example the system may have a high power mode, normal power mode, standby mode, and a shut down mode, as well as other modes depending on the application and specific system requirements.

Figure 7:
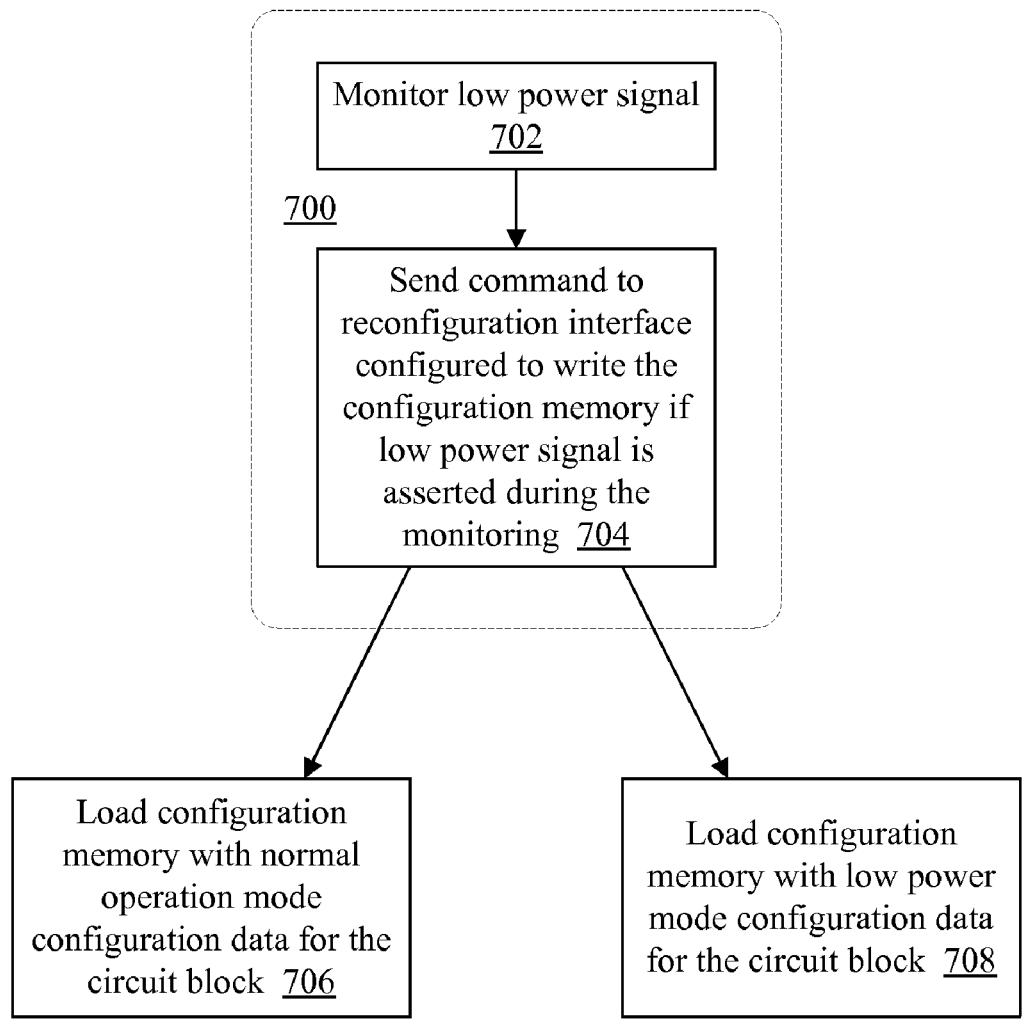
FIG. 7 illustrates the steps of an exemplary method of operating an integrated circuit.

FIG. 7 illustrates the steps of an exemplary method of operating an integrated circuit including a circuit block configurable by a configuration memory. In step 700, it is determined whether to operate the circuit block in a normal operation mode or a low power mode. The determining can be performed, for example, by monitoring a low power signal (step 702), and sending a command to a reconfiguration interface configured to write the configuration memory if the low power signal is asserted during the monitoring (step 704). Based on the determining of the normal operation mode, the configuration memory is loaded with either normal operation mode configuration data (step 706) or low power mode configuration data (step 708) for the circuit block.

It can be seen that while some specific embodiments herein relate to FPGA implementations, embodiments of the present invention can also be implemented in circuits other than FPGAs. For example, embodiments of the invention can be applied to other integrated circuits that have reconfigurable circuit elements, including but not limited to programmable logic arrays, custom integrated circuits with reconfigurable circuit blocks, or general purpose integrated circuits with reconfigurable circuit blocks.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A method of operating an integrated circuit comprising a circuit block configurable by a configuration memory, the method comprising:
   determining whether to operate the circuit block in a normal operation mode or a low power mode;
   based on the determining, loading the configuration memory with normal operation mode configuration data for the circuit block, if the normal operation mode is determined;
   wherein the loading of the configuration memory with normal operation mode configuration data includes storing the normal operation mode configuration data in a set of configuration memory cells;
   wherein the normal operation mode configuration data in the set of configuration memory cells configures the circuit block to generate an output signal as a function of one or more input signals;
   enabling performance of the function provided by the circuit block in response to the normal operation mode configuration data loaded in the set of configuration memory cells;
   based on the determining, loading the configuration memory with low power mode configuration data for the circuit block, if the low power mode is determined;
   wherein the low power mode configuration data is different from the normal operation mode configuration data;
   wherein the loading of the configuration memory with low power mode configuration data includes storing the low power mode configuration data in the set of configuration memory cells; and
   disabling performance of the function provided by the circuit block in response to the low power mode configuration data loaded in the set of configuration memory cells.

2. The method of claim 1, wherein the determining is performed by a power manager.

3. The method of claim 1, wherein:
   the circuit block comprises a multiplexer; and
   the low power mode configuration data is configured to place the multiplexer in a low-leakage sleep mode configuration.

4. The method of claim 1, wherein:
   the circuit block comprises a switch configured to place the circuit block in a power-down state; and
   the low power mode configuration data is configured to cause the switch to place the circuit block in the power-down state.

5. The method of claim 1, wherein loading the configuration memory comprises writing data to a configuration memory of a programmable logic device (PLD).

6. The method of claim 5, wherein loading the configuration memory further comprises loading a configuration bitstream to the configuration memory of the PLD.

7. The method of claim 1, wherein loading the configuration memory with the low power mode configuration data comprises performing a partial reconfiguration of the circuit block.

8. The method of claim 1, wherein the determining comprises:
   monitoring a low power signal; and
   sending a command to a reconfiguration interface configured to write the configuration memory if the low power signal is asserted during the monitoring.

9. A power managed circuit system, comprising:
   a configurable circuit block;
   a configuration memory coupled to the circuit block, the configuration memory configured to configure the circuit block;
   a reconfiguration interface coupled to the configuration memory, the reconfiguration interface configured to write configuration data to the configuration memory; and
   a power management unit coupled to the reconfiguration interface, the power management unit configured to
      determine one of a plurality of circuit block operation modes, and
      through the reconfiguration interface, initiate writing to a set of configuration memory cells of the configuration memory with one of a plurality of data sets corresponding to the one of the plurality of circuit block operation modes, wherein the plurality of circuit block operation modes comprises a normal operation mode and a low power operation mode;
   wherein a first data set corresponds to the normal operation mode, and a second data set that is different from the first data set corresponds to the low power operation mode;

wherein the configurable circuit block, responsive to the first data set being written in the set of configuration memory cells of the configuration memory, is configured to generate an output signal as a function of one or more input signals; and wherein the configurable circuit block, responsive to the second data set being written in the set of configuration memory cells of the configuration memory, is disabled from performing the function.

10. The system of claim 9, further comprising a bitstream memory, the bitstream memory comprising configuration bitstream data corresponding to the plurality of circuit block operation modes.

11. The system of claim 10, wherein the bitstream memory comprises a non-volatile memory.

12. The system of claim 9, wherein the circuit block is disposed on a programmable logic device (PLD).

13. The system of claim 12, wherein the configuration memory and the reconfiguration interface are disposed on the PLD.

14. The system of claim 12, wherein:
the configurable circuit block is implemented with user logic resources of the PLD; and
implementation of the plurality of circuit block operation modes does not require additional user logic resources of the PLD to control power consumption.

15. The system of claim 9, wherein:
the circuit block comprises a switch configured to place the circuit block in a power-down state; and
the switch is configured by the configuration memory in the power-down state in the low power operation mode.

16. The system of claim 9, wherein:
the circuit block comprises a driver circuit; and
the driver circuit is configured by the configuration memory in a disabled state in the low power operation mode.

17. A power management controller, comprising:
mode determination logic configured to determine whether a circuit block operates in one of a plurality of power modes, wherein
the circuit block is coupled to a set of configuration memory cells of a configuration memory,
the set of configuration memory cells controls a configuration of the circuit block, and
the configuration of the circuit block is based on a power mode; and
a power management interface configured to be coupled to a reconfiguration interface, wherein
the reconfiguration interface is configured to write to the configuration memory, and
the power management interface is configured to command the reconfiguration interface to load the configuration memory with configuration data corresponding to one of the plurality of power modes;
wherein the plurality of power modes includes a first power mode and a second power mode, a first configuration data set of the configuration data corresponds to the first power mode, and a second configuration data set of the configuration data corresponds to the second power mode;
wherein the first configuration data set is different from the second configuration data set;
wherein the circuit block, responsive to the first configuration data set being loaded in the set of configuration memory cells, is configured to generate an output signal as a function of one or more input signals; and
wherein the circuit block, responsive to the second configuration data set being loaded in the set of configuration memory cells, is disabled from performing the function.

18. The power management controller of claim 17, wherein the circuit block is implemented on a programmable logic device (PLD).

19. The power management controller of claim 18, wherein the power management controller and the configuration memory are implemented on the PLD.

20. The power management controller of claim 17, further comprising a bitstream memory interface configured to be coupled to a bitstream memory, wherein:
the bitstream memory comprises a plurality of configuration bitstreams corresponding to the plurality of power modes; and
the reconfiguration interface is configured to transmit a configuration bitstream corresponding to the power mode determined by the power mode determination logic from the bitstream memory to the configuration memory.

* * * * *